United States Patent [19]
Poh

[11] Patent Number: 6,066,537
[45] Date of Patent: May 23, 2000

[54] METHOD FOR FABRICATING A SHIELDED MULTILEVEL INTEGRATED CIRCUIT CAPACITOR

[75] Inventor: David Ho Seng Poh, Singapore, Singapore

[73] Assignee: Tritech Microelectronics, Ltd., Singapore, Singapore

[21] Appl. No.: 09/017,406

[22] Filed: Feb. 2, 1998

[51] Int. Cl.$^7$ .................................................. H01L 21/20
[52] U.S. Cl. ........................ 438/393; 438/394; 438/251
[58] Field of Search .................................. 438/393, 381, 438/394, 250, 251, 239; 361/313

[56] References Cited

U.S. PATENT DOCUMENTS

| | | | |
|---|---|---|---|
| 4,700,457 | 10/1987 | Matsukawa | 438/396 |
| 4,914,456 | 4/1990 | Alter | 361/313 |
| 5,021,920 | 6/1991 | Smith | 361/311 |
| 5,077,225 | 12/1991 | Lee | 438/396 |
| 5,166,858 | 11/1992 | Frake et al. | 361/313 |
| 5,220,483 | 6/1993 | Scott | 361/313 |
| 5,589,416 | 12/1996 | Chittipeddi . | |
| 5,874,770 | 2/1999 | Saia et al. | 257/536 |

OTHER PUBLICATIONS

Analog MOS Integrated Circuits for Signal Processing, G. Temes & R. Gregorian, John Wiley & Sons, United States of America, 1996, pp. 514–519.

Primary Examiner—Tuan H. Nguyen
Attorney, Agent, or Firm—George O. Saile; Stephen B. Ackerman; Billy Knowles

[57] ABSTRACT

A multilevel capacitor structure compatible with CMOS processing for use in switched capacitor circuits is disclosed. The capacitor structure has an associated parasitic capacitor which is placed in such a way so as to minimize the impact on the performance of a the switched capacitor circuit. The parasitic capacitor is formed between a first plate of the shielded capacitor and a diffusion well within a substrate. The diffusion well is connected to a quiet voltage reference source to isolate the shielded capacitor from noise present on the substrate. The shielded capacitor has a first plate that is fabricated from a first conductive material such as polycrystalline silicon or polycide, a second plate fabricated from a second conductive material such as a first level of metal on an integrated circuit, and a third capacitor plate fabricated from a second level of metal of an integrated circuit. The first plate and the third plate are connected to give a total capacitance given by the sum of capacitances between the first plate and second plate and between the second plate and third plate.

4 Claims, 8 Drawing Sheets

METHOD FOR FABRICATING A SHIELDED MULTILEVEL INTEGRATED CIRCUIT CAPACITOR

BACKGROUND OF THE INVENTION

1. Field of the Invention

This invention relates to the formation of a capacitor within integrated circuits and more particularly to capacitor structures that are immune to noise and unwanted signals for use in switched capacitor circuits.

2. Description of Related Art

The design and structure of capacitors within integrated circuits using standard CMOS processing is well understood in the art. Generally one of the plates, the bottom plate, is formed from the semiconductor substrate or is formed by a conductive layer of metal or polycrystalline silicon or polycide (a polycrystalline silicon layer covered with a layer of silicide) isolated from the substrate by an insulating layer of a material such a silicon dioxide and is directly coupled to the substrate through a parasitic capacitor. The parasitic capacitor often has a capacitance that is approximately equal to that of the designed capacitor.

When the designed capacitor is incorporated into an analog integrated circuit such as a switched capacitor filter, the impact of the parasitic capacitor must be accounted for in the design of the operating parameters of the analog integrated circuit.

Additionally, in integrated circuits combining analog and digital functions, noise and unwanted signals can be coupled from the digital circuits to the analog circuits causing improper operation of the analog circuits. The coupling of the noise and unwanted signals can be alleviated by proper placement or layout of the circuit components within the integrated circuits. In *Analog MOS Integrated Circuits for Signal Processing*, G. Temes & R. Gregorian, John Wiley & Sons, United States of America, 1986. In FIG. 7.43 on page 515, a power supply distribution and return circuit for the analog and digital circuits is shown. If the analog circuits share a common power supply distribution and return circuit with the digital circuits, the noise generated by such components of the digital circuitry as the digital clocking circuits, the simultaneous switching of the digital circuits, and the digital circuits rise and fall times will cause the power supply distribution and return circuit to couple this noise to the analog circuitry.

The power supply return circuit is often the substrate for the integrated circuits. With the noise and unwanted signals generated by the digital circuits present on the substrate, this noise will be coupled directly to the analog circuitry on the power supply distribution and return circuit. To avoid this problem, the power supply distribution and return circuits of the analog circuits are separated from those of the digital circuits.

However, just separating the power supply distribution and return circuits will not completely eliminate the coupling of the noise and unwanted signals coupled from the digital circuits to the analog circuits. The noise injected to the substrate from the power supply distribution and return circuit of the digital circuits will be coupled to the analog circuits directly through the designed capacitors if its bottom plate is the substrate, or through the parasitic capacitor, if the bottom plate is a conductive layer of metal, polycrystalline silicon, or polycide. Thus it has been recommended, such as in Temes and Gregorian at p. 517, that the bottom plate not be connected to the inverting input terminal of an op amp.

One technique to shield the design capacitor from the substrate, as shown in Temes and Gregorian, FIG. 7.47 page 518, by placing a diffusion of the opposite conductivity as the substrate between the design capacitor and the substrate. The diffusion is connected to the power supply reference voltage thus providing a low impedance path for any noise coupled from the substrate and avoiding the coupling to the analog circuit.

Other techniques, as shown in U.S. Pat. No. 5,220,483 (Scott), create a shielded top plate for the design capacitor and an unshielded bottom plate. The bottom plate will in fact be two layers of conductive material (one polycrystalline silicon and the other a second layer metal) connected together. The shielded top plate will be a first level of metal placed between the polycrystalline silicon and the second layer metal. Additionally, a second shielding layer of the first layer metal formed as a ring layer around the periphery of the top plate, will be connected to the power supply return circuit of the analog circuits.

As conventionally shown in the Scott patent, the shielded top plate will be placed in the analog circuits at nodes that would be sensitive to noise and the unshielded bottom plate at locations in the analog circuits that are insensitive to noise.

However, because the parasitic capacitor still exists, it now must be placed at locations restricted within the analog circuits. For example referring to the switched capacitor filter FIG. 5a, if capacitor CF1 were implemented as conventionally described, the shielded top plate would be connected to the inverting input—of the operational amplifier op amp.

Figure 5A:
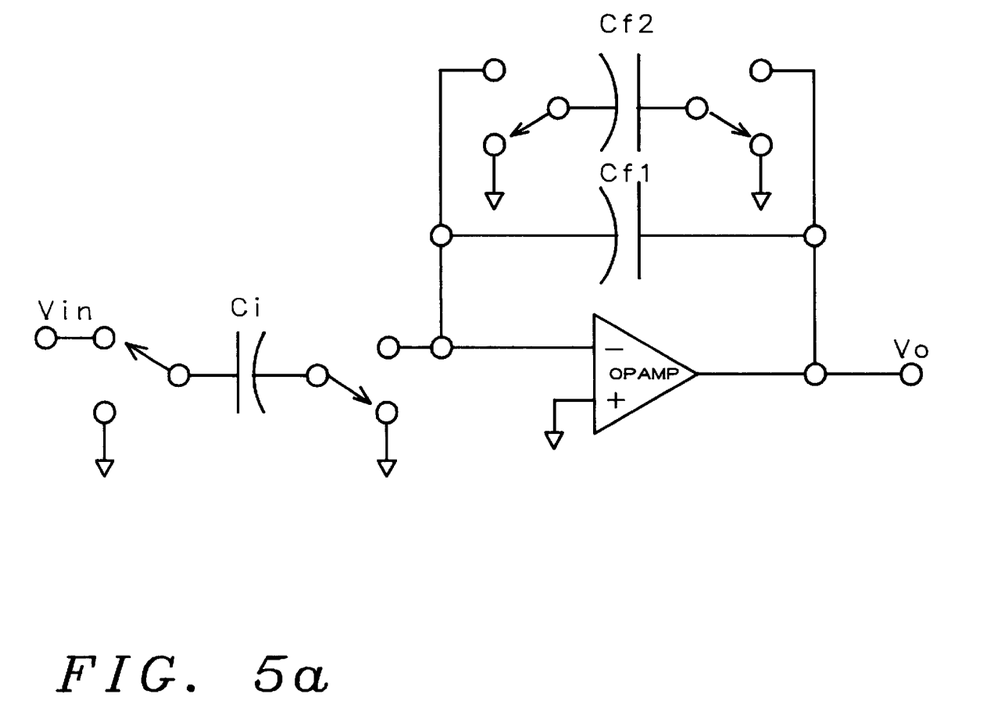

The unshielded bottom plate would be placed at the output of the operational amplifier op amp thus placing the parasitic capacitor in parallel with the load capacitance Cl. The capacitive load on the output of the operational amplifier op amp will now be:

$$C_{eq} = C_l + C_p + \frac{C_{f1}(C_i)}{C_{f1} + C_i}$$

$C_{eq}$ is the equivalent load capacitance of the output of the operational amplifier.

$C_l$ is the actual load capacitance at the output of the operational amplifier.

$C_{f1}$ is the feedback capacitance of the operational amplifier.

$C_i$ is the input capacitance of the operational amplifier.

$C_p$ is the parasitic capacitance at the bottom plate of the capacitor $C_{f1}$ Since the capacitance of the parasitic capacitor is approximately the same as that of the design capacitor, the parasitic capacitor can dramatically impact the performance of the switched capacitor filter.

U.S. Pat. No. 5,166,858 (Frake) shows a three layer capacitor having a first plate formed of a polycrystalline silicon conductor isolated from a substrate by an insulating layer. A second plate is formed of a first metal layer that is insulated form the first plate by a second insulating layer. A third plate is formed of a second metal layer and connected by a first metal connection to the first plate thus forming a "sandwich capacitor". The capacitor structure is for use in voltage doubling and voltage tripling applications on integrated circuits.

U.S. Pat. No. 5,589,416 (Chittipeddi) describes a method for the manufacture of an integrated circuit capacitor where the first plate of the capacitor is a polycrystalline silicon created during the processing of forming the gates of MOS Transistors. The second plate is formed of a Titanium Nitride upon a hard mask insulating layer. A second metal is in contact with the second plate of the capacitor to connect the capacitor to other circuitry of the integrated circuit.

U.S. Pat. No. 5,021,920 (Smith) describes a multilevel capacitor having interleaved capacitive plates of alternate conductivity types between layers of dielectric material. The layers of alternate conductivity types are connected together with one layer of one conductivity type at one connection and a second layer of the alternate conductivity type at the other connection. The alternate layers are isolated from each other by a biasing voltage attached to the connected layers. The layers of opposite conductivity types from the connecting layer form diodes preventing conduction of current through the diodes essentially isolating the layers from one another. This structure is suitable for dynamic random access memory.

SUMMARY OF THE INVENTION

An object of this invention is to create a multilevel capacitor structure compatible with CMOS processing for use in the application of switched capacitor circuits.

Another object of this invention is to create a capacitor structure where the placement of the associated parasitic capacitor created during the fabrication of the capacitor structure will be in such a way as to minimize the impact of the parasitic capacitance upon the performance of a switched capacitor circuit.

Another object of the invention is to create a capacitor structure upon a semiconductor substrate having a shielded bottom plate to isolate the bottom plate of the capacitor from unwanted noise and signals present within the semiconductor substrate.

To accomplish these and other objects, a capacitor structure has a diffusion well formed upon a semiconductor substrate. The diffusion well may be an N-well placed in a P-type substrate. Above the diffusion well, a first layer of an insulating material such as silicon dioxide is placed. Openings in the silicon dioxide allow the implantation of highly doped material into the N-well to create a N+ contact. This N+ contact is attached to a plurality of contacts to allow the diffusion well to be connected to a quiet voltage source. The quiet voltage source is constructed so as to be isolated from noise and unwanted signals.

A first capacitor plate made of a conductive material such as polycrystalline silicon or polycide is formed on the first layer of the insulating material. The first capacitor plate is placed within the boundaries of the diffusion well.

A second layer of the insulating material is placed over the first capacitor plate and the first layer of insulating material. The second layer of insulating material has openings to allow external connection to the first capacitor plate and the diffusion well.

A second capacitor plate of a second conducting material such as the first wiring level metal for an integrated circuit is formed on the second layer of insulating material. The second capacitor plate is placed within the boundaries of the first capacitor plate.

A third layer of the insulating material is placed over the second capacitor plate and the second layer of insulating material. The third layer of insulating material has openings to allow the external connection to the first capacitor plate, second capacitor plate and the diffusion well.

A third capacitor plate of a conducting material such as a second level of wiring metal for integrated circuits is formed over the third layer of insulating material. The third capacitor plate has boundaries that are equal to those of the first capacitor plate.

A second plurality of contacting means (a via and a contact) connect the first capacitor plate to the third capacitor plate through the openings in the second and third layers of insulating material.

A first capacitor connecting means will connect the first and third capacitor plates to the input of an op-amp if it is used as a non-switched feedback capacitor in an operational amplifier type integrator. A second capacitor connecting means will connect the second capacitor plate to the output of the said op-amp. In the case of a capacitor which is switched, for instance the switched capacitor at the input and as a feedback network, the first and third plates (bottom plate) will be connected to switches which either switch to the analog ground voltage or to the op-amp input terminal.

A shielding layer is optionally formed on the second layer of insulating material of the first level of wiring metal so as to surround the second capacitor plate. The shielding layer is connected to a quiet voltage source to shield the second capacitor plate from noise and unwanted signals.

BRIEF DESCRIPTION OF THE DRAWINGS

FIG. 5a is schematic drawing of a switched capacitor filter to.

DETAILED DESCRIPTION OF THE INVENTION

Figure 1:
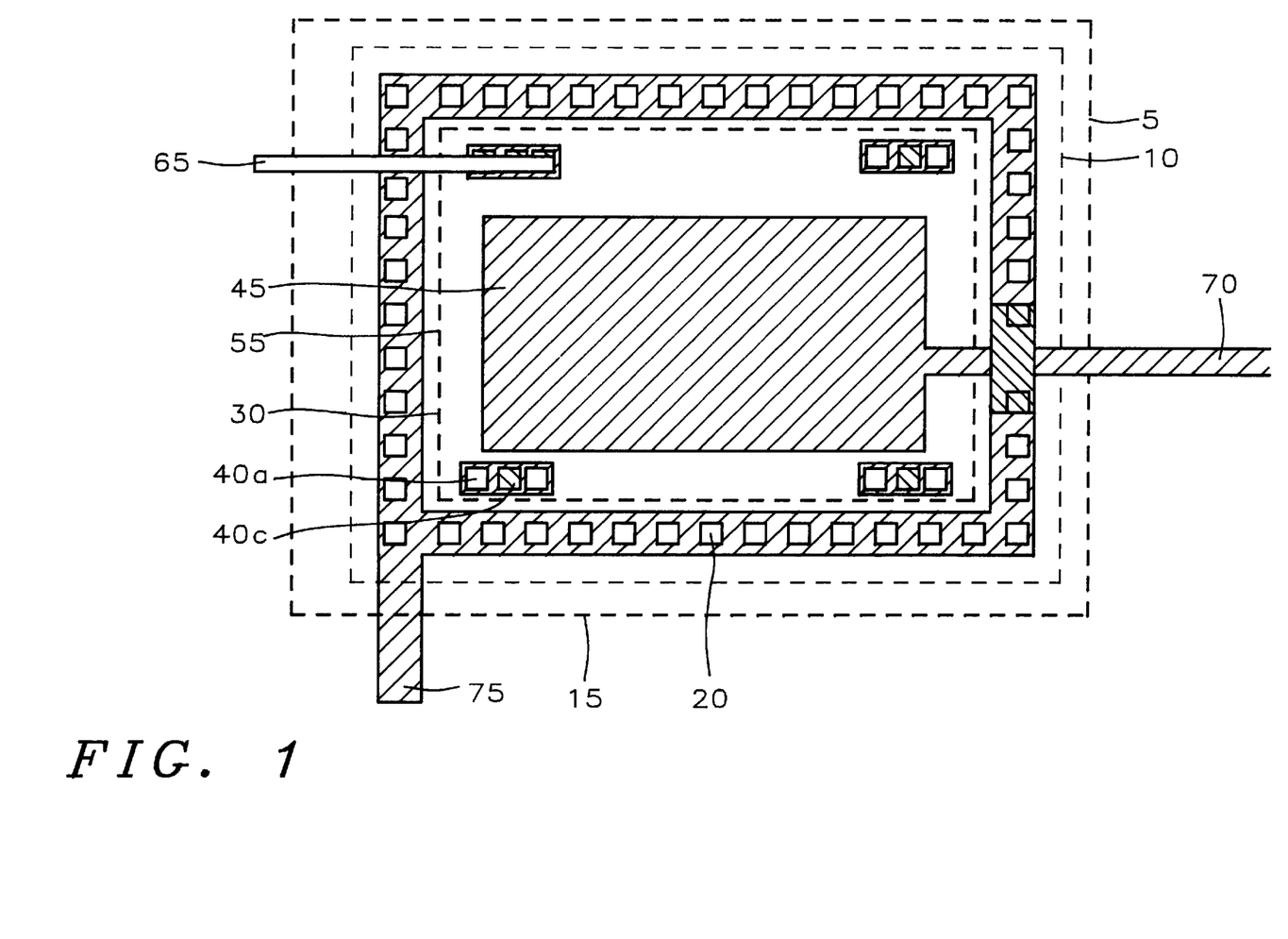
FIG. 1 is a planar view of a first embodiment of a capacitor structure of this invention.
Figure 2:
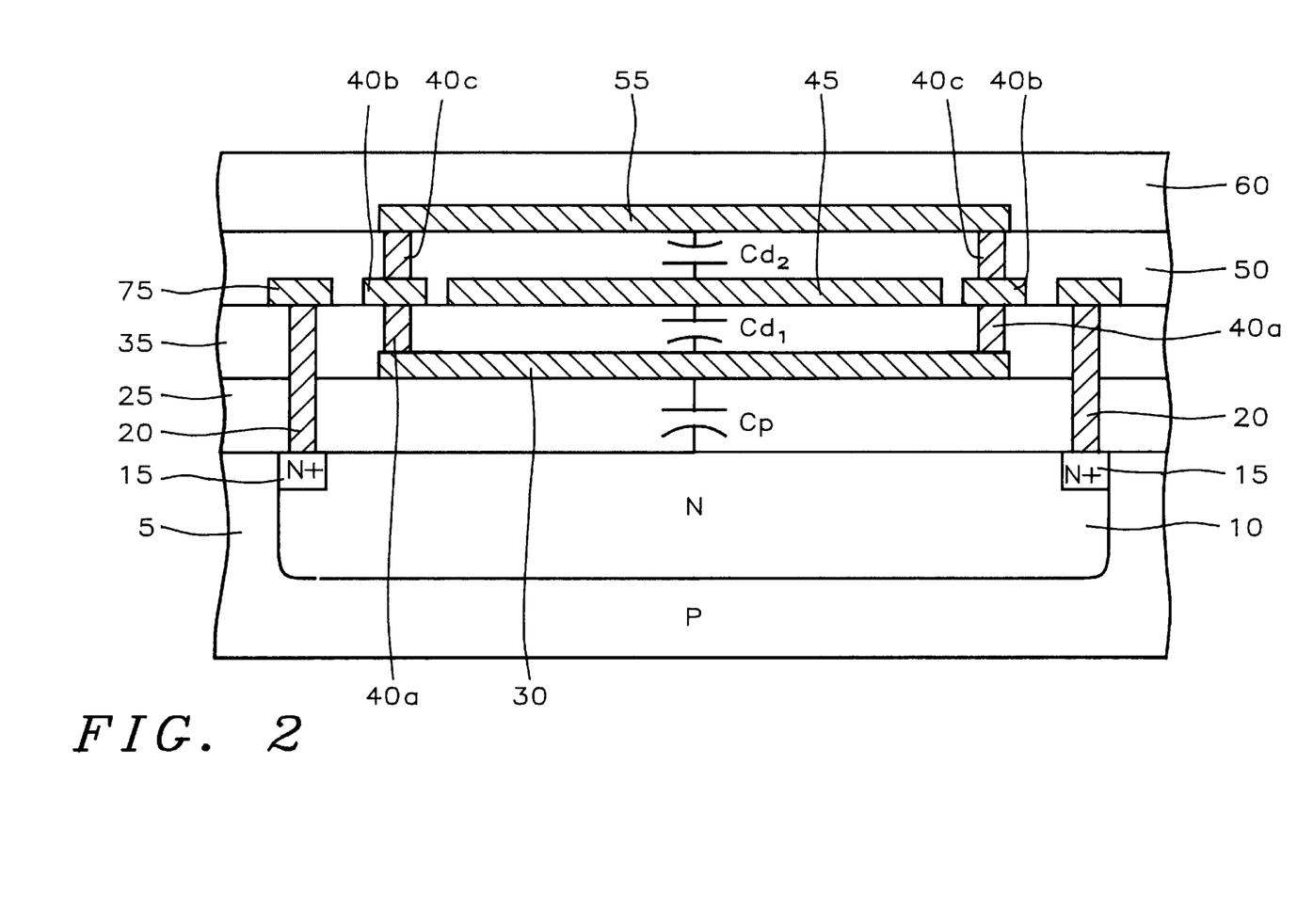
FIG. 2 is cross sectional view of the first embodiment of the capacitor structure of this invention.

Referring now to FIGS. 1 and 2 to understand the construction of the capacitor structure of this invention. An N-well 10 is diffused into the P-type substrate 5. N$^+$ contact diffusions 15 are placed in the N-well 10 to form a low resistance path from the N-well 10. A contact metal 20 such as titanium or tungsten is formed to contact the N$^+$ contacts 15 in the N-well 10. The contact metal 20 will connect to a first level metal 75 that will be coupled to a quiet voltage source such as a analog voltage reference supply of the integrated circuit to divert any noise coupled from the substrate 5 to the N-well away from the capacitor structure.

An insulating material such as silicon dioxide is then formed on the surface of the substrate to provide an electrically insulated layer 25 on to which a first conductive material such as polycrystalline silicon or polycided silicon is deposited. The first conductive material is formed to create the first capacitor plate 30. The first capacitor plate will be formed within the boundaries of the N-well diffusion 10.

A second electrically insulated layer 35 is formed of the insulating material over the first capacitor plate 30 and the first electrically insulated layer 25. A second conductive material such as aluminum that is used for the first metal wiring layer of an integrated circuit process is placed on the second electrically insulated layer 35. The second conductive material is formed to create a second capacitor plate 45. The boundaries of the second capacitor plate 45 are within the boundaries of the first capacitor plate 30.

A third electrically insulated layer 50 is formed over the second capacitor plate 45 and the second electrically insulated layer 35. A third conductive material such as the aluminum that is used for the second metal wiring layer of the integrated circuit process is placed on the third electrically insulated layer 50. The third conductive material is formed to create a third capacitor plate 55. The boundaries of the third capacitor plate 55 may be made identical to those of the first capacitor plate 30.

A contact metal 40a and 40c such as titanium and tungsten are formed in opening of the second and third electrically insulated layers 35 and 50 and a small amount of the second conductive material 40b forms vias that connect the first capacitor plate 30 to the third capacitor plate 55. A wiring segment 65 of the third conductive material will connect the first and third capacitor plates 30 and 55 to external circuitry. A second wiring segment 70 of the second conductive material will connect the second capacitor plate 45 to the external circuitry. As may be seen by those skilled in the art, by appropriate use of the contact metals, the wiring segments 65, 70, and 75 may be actually formed on other conductive material layers.

Figure 3:
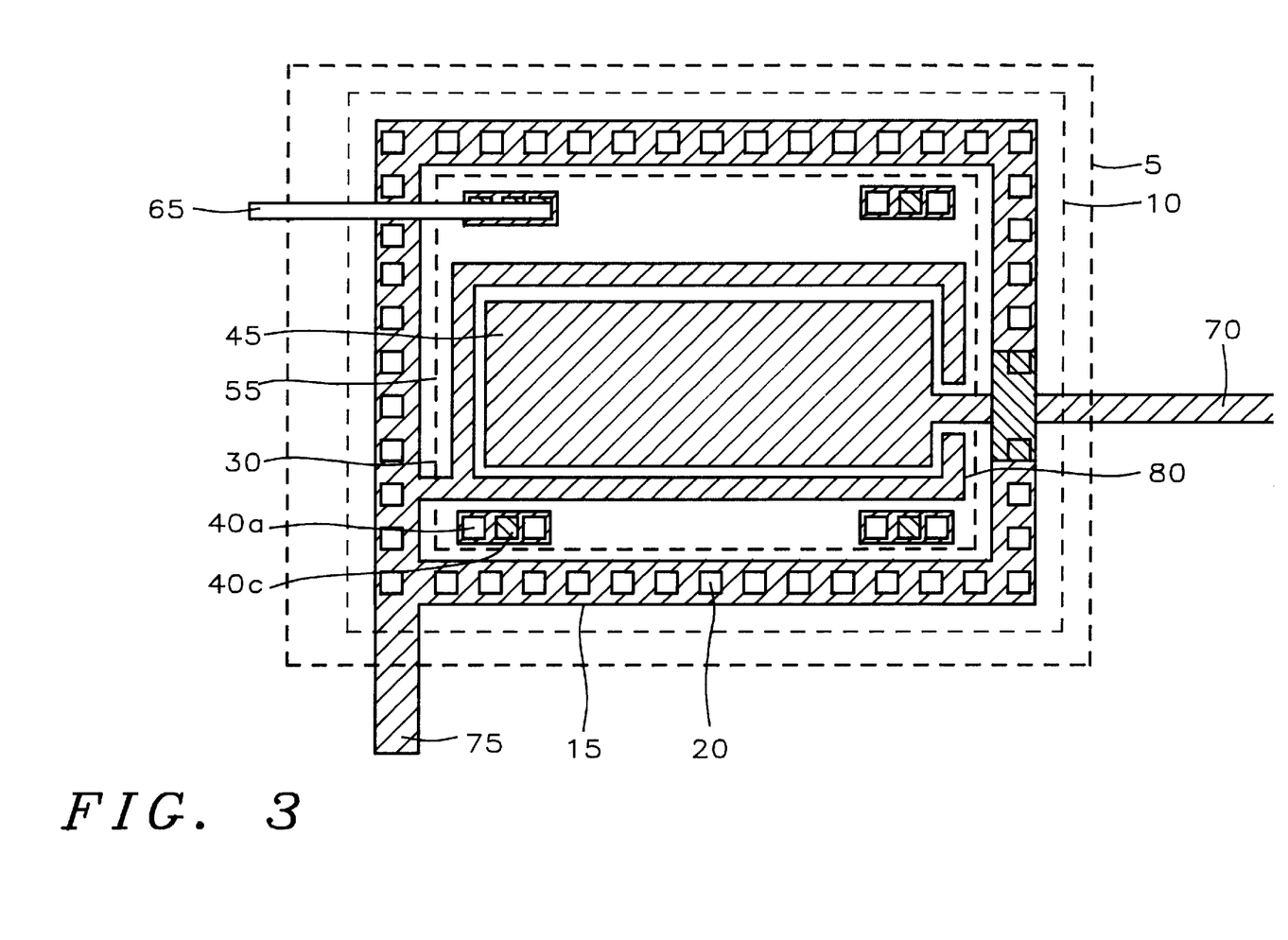
FIG. 3 is a planar view of a second embodiment of a capacitor structure of this invention.
Figure 4:
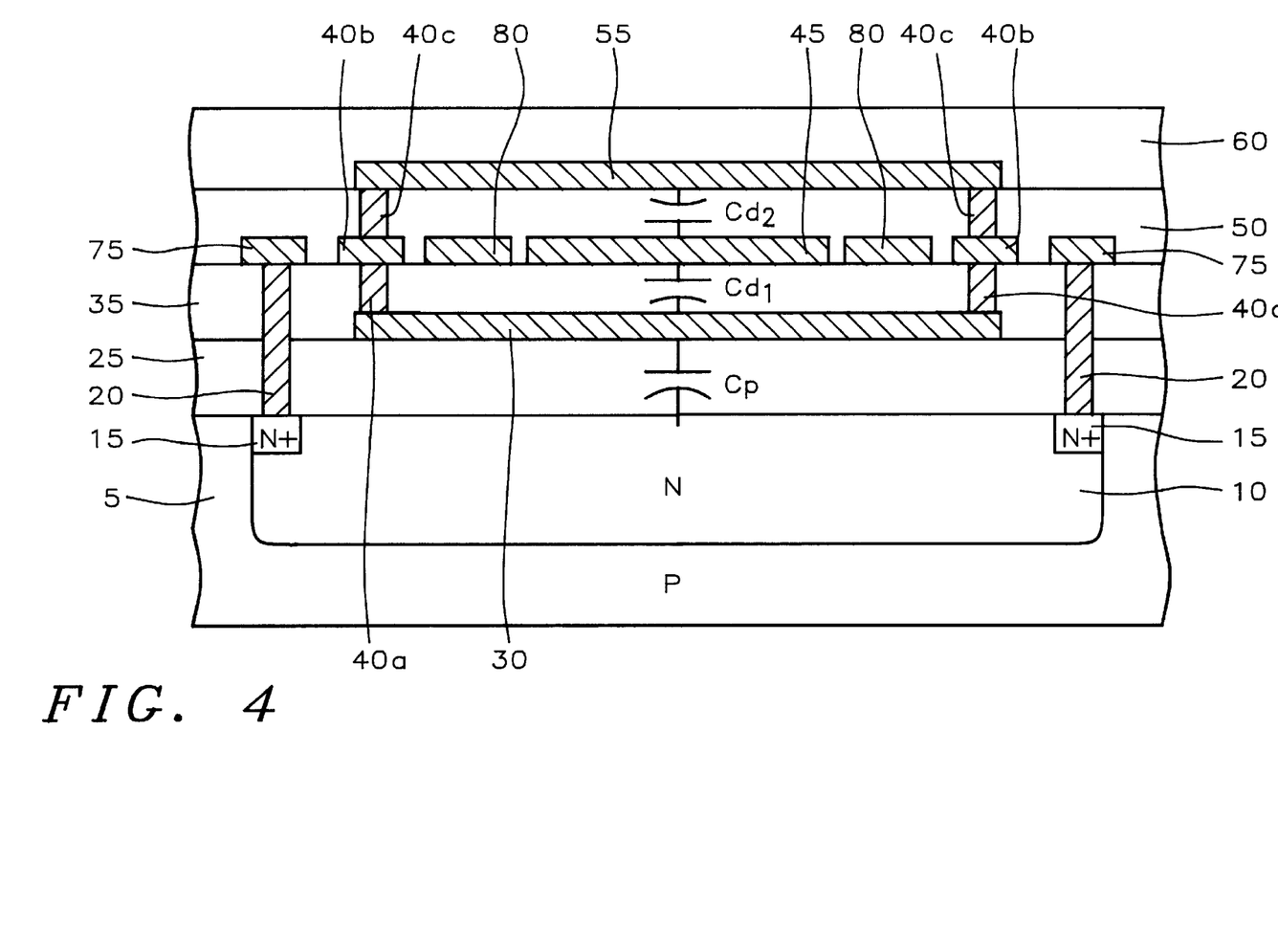
FIG. 4 is a cross sectional view of the second embodiment of the capacitoe tructure of this invention.

Referring now to FIGS. 3 and 4, an optional shielding layer 80 can be constructed from the second conductive material and placed to surround the second capacitor plate 45. The shielding layer is connected to the metal segment 75 that is coupled to the quiet voltage source. This shielding layer 80 will further isolate the second plate 45 from noise and unwanted signals.

Referring now to FIGS. 2 and 4, the capacitor structure forms the capacitor $C_{d1}$ between the first capacitor plate 30 and the second capacitor plate 45 and the capacitor $C_{d2}$ is formed between the second capacitor plate 45 and the third capacitor plate 55. The capacitance of the desired designed capacitor will be the sum of the capacitors $C_{d1}$ and $C_{d2}$. A parasitic capacitor $C_p$ will be formed between the first capacitor plate 30 and the N-well diffusion 10. This parasitic capacitor $C_p$ will have a capacitance that is equivalent or larger than the capacitance of the designed capacitor ($C_{d1}$+$C_{d2}$) and will have a significant impact on the performance of the external circuitry connected to the designed capacitor ($C_{d1}$+$C_{d2}$). This impact must be carefully considered in the design of the external circuitry.

The N-well shielding diffusion 10 will isolate the first capacitor plate 30 from the noise and unwanted signals present in the substrate 5, thus allowing the placement of the parasitic capacitor $C_p$ within the external circuitry such that any undesired impact or the parasitic capacitor $C_p$ can be minimized.

Figure 5B:
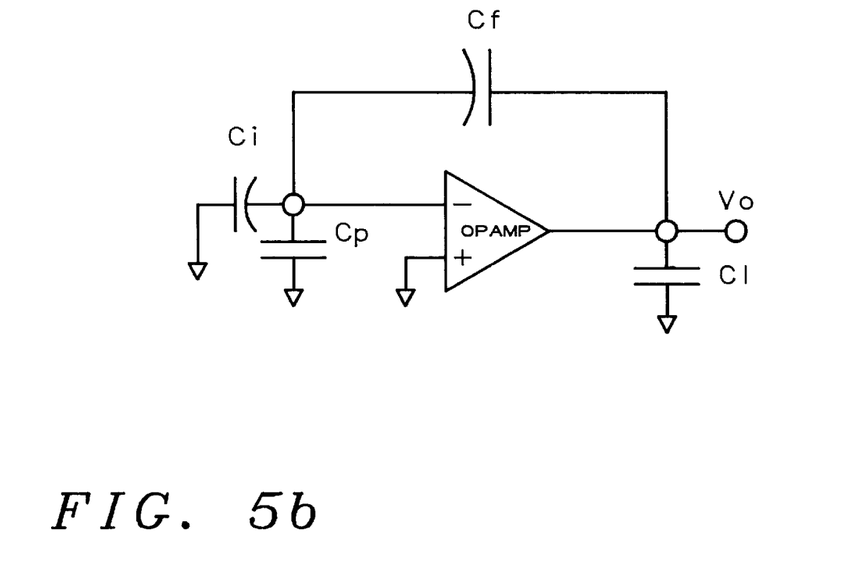
FIG. 5b is schematic drawing of one state of a switched capacitor filter showing an optimum placement of the capacitor structure of this invention.

To show an application of this invention and to explore the advantages of the capability of placing the parasitic capacitor $C_p$ of FIGS. 2 and 4, refer now to FIGS. 5a and 5b.

FIG. 5a shows a schematic of a switched capacitor circuit. The circuit consists of two switched capacitors $C_i$, $C_{f2}$, one non-switched capacitor $C_{f1}$ and a differential operational amplifier op amp. The switched capacitors $C_i$, $C_{f2}$ and are used in such a way that the bottom plates 30 and 55 of these two capacitors are connected to switches which can either switch to an analog ground voltage or to the inverting input of the opamp. The integrator feedback capacitor $C_{f1}$ is connected across the op-amp output $V_o$ and input in such a way that its bottom plate is connected to the inverting input—of op amp and the top plate 45 to the output.

Placing a parasitic capacitance that is connected directly to the semiconductor substrate 5 of FIGS. 2 and 4 will couple noise to the inverting input—of the operational amplifier and consequently be amplified to the output $V_o$. If as described above for U.S. Pat. No. 5,220,483 (Scott) the parasitic capacitor is placed at the output $V_o$, it will be placed in parallel with the load capacitance $C_l$ of FIG. 5b and impact the operation of the switched capacitor filter.

With this invention the parasitic capacitor $C_p$ of FIGS. 2 and 4 will be connected to a quiet voltage source and not have any perturbation resulting from the noise and unwanted signals coupled to the substrate 5. The parasitic capacitor $C_p$ of FIGS. 2 and 4 may now be placed at the inverting input—of the operational amplifier op amp with greatly reduced noise or unwanted signals being coupled to the operational amplifier op amp.

FIG. 5b shows the switched capacitor filter at one switch state with the switches removed and the parasitic capacitance in place at the inverting input—of the operational amplifier op amp. The equivalent capacitance as viewed at the output $V_o$ now becomes.

$$C_{eq} = C_l + \frac{C_f(C_p + C_i)}{C_f + (C_p + C_i)}$$

where:
$C_{eq}$ is the equivalent capacitance at the output node $V_o$.
$C_l$ is the load capacitance of the circuitry attached to the output node $V_o$.
$C_i$ is the input switched capacitor.
$C_f$ is the feedback capacitance from the output of the operational amplifier $V_o$ to the inverting input—of the operational amplifier.
$C_p$ is the parasitic capacitance of the capacitor structure found at the bottom plate of capacitor $C_f$.

Since the parasitic capacitance $C_p$ is approximately equal to $C_f$ and the input capacitance $C_i$ and the load capacitance $C_l$ are much smaller than the feedback capacitance $C_f$, the equivalent capacitance will approach that of the feedback capacitance $C_f$ in series with the parasitic capacitance $C_p$ or approximately one half the value of the feedback capacitance $C_f$. In contrast, in the prior art approach in which the parasitic capacitance $C_p$ is placed at the output $V_o$, $C_{eq}$ becomes equivalent to the parasitic capacitance $C_p$ in parallel with the load capacitance $C_l$ and the feedback capacitance $C_f$ in series with the input capacitance $C_i$. The parasitic capacitance $C_p$ will now dominate the equivalent capacitance $C_{eq}$.

The effect of this can be shown by examining the settling time constant of the output $V_o$. The settling time constant will be:

$$tc = \frac{Ceq}{gm} \times \frac{1}{Fb}$$

where:
tc is the settling time constant of the operational amplifier.
$C_{eq}$ is the equivalent capacitance at the output node $V_o$.
gm is the transconductance of the operational amplifier op amp.
Fb is the feedback factor applied on the op-amp.

If the parasitic capacitance $C_p$ is placed at the inverting input—of the operational amplifier op amp as with this invention, the equivalent capacitance now is:

$$C_{eq} = C_l + \frac{C_f(C_p + C_i)}{C_f + (C_p + C_i)} \approx \frac{C_f^2}{2C_f} = \frac{1}{2}C_f$$

The feedback factor Fb is given by:

$$Fb = \frac{C_f}{(C_f + C_i + C_p)} \approx \frac{1}{2}$$

and the settling time constant is:

$$tc = \frac{Cf}{gm}$$

However, if the parasitic capacitance is placed at the output $V_o$ of the operational amplifier op amp as in the prior art, the equivalent capacitance becomes:

$$C_{eq} = C_l + C_p + \frac{C_{fl}(C_i)}{C_{fl} + C_i} \approx C_f$$

Since $C_p \approx C_f$

The feedback factor is given by:

$$Fb = \frac{C_f}{(C_f + C_i)} \approx 1$$

Now the settling time constant will be equal to $$tc = \frac{C_f}{gm}$$

To a first order approximation, the analysis shows that the placement of the stray capacitor either on the input or at the output node of the op-amp does not affect the settling performance. This is especially true for a one stage op-amp where the dominant pole is at the output of the op-amp.

However for a two stage op-amp, the placement of the stray capacitor on the output node will double the equivalent load capacitance at the output node and will degrade the phase margin of the amplifier. This in turn would cause overshooting response and degrade the settling performance. The op-amp therefore has to be designed with a greater internal compensation capacitor as well as with greater output bias current in order to increase the phase margin and maintain settling performance.

Figure 7A:
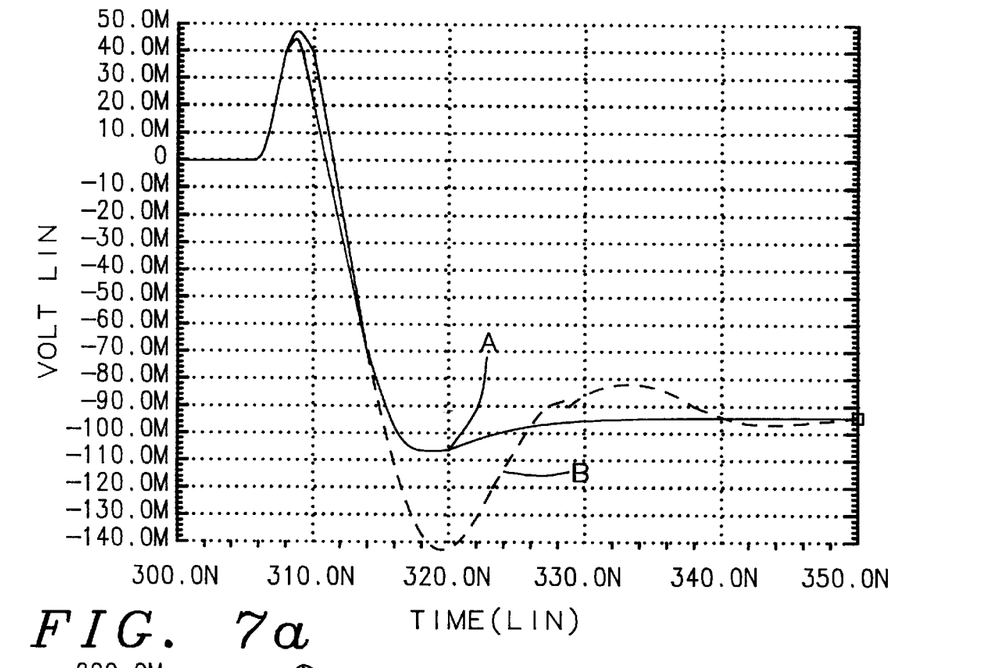
FIGS. 7a and 7b are plots of SPICE simulations of an operational amplifier switched capacitor integrator demonstrating the effects of placement of the parasitic capacitor of this invention upon settling time.

FIG. 7a shows the Spice simulation comparison plots of two op-amp switched capacitor integrators similar to FIG. 5a. One is with the bottom plate stray capacitance (Cp) connected to the input(A) and the other connected to the output(B).

The same two stage op-amp is used in both the integrators. The following values were chosen for the capacitors: $C_i$=1pF, $C_f$=40pF, $C_p$=40pF, $C_l$=1pF.

As shown the integrator with the bottom plate stray capacitance connected to the output(B) exhibits a large overshoot, which reduces the settling time.

The effect of the appropriate placement of the parasitic capacitance can be further understood by examining the slew rate of the operational amplifier. The maximum Slew Rate here is defined as the maximum voltage over time slope. In the example of FIG. 5b where the parasitic capacitance is placed at the inverting input—of the operational amplifier op amp, the maximum slew rate becomes:

$$\max SR = \frac{I_b}{(C_l + C_f)} \approx \frac{I_b}{C_f}$$

where:
max SR is the slew rate of the operational amplifier op amp.
$I_b$ is the maximum output current of the operational amplifier op amp.
$C_i$ is the input capacitance
$C_f$ is the feedback capacitance.
$C_l$ is the load capacitance.

However, if the parasitic capacitance is placed at the output $V_o$ of the operational amplifier op amp, as required in the prior art, the slew rate becomes:

$$\max SR = \frac{I_b}{C_l + C_f + C_p} \approx \frac{I_b}{2C_f}$$

where:
$C_p$ is the parasitic capacitance.

Thus, the capability to place the parasitic capacitor at the noninverting input—of the operational amplifier op amp, allows the maximum slew rate to improve by almost a factor of two.

Figure 7B:
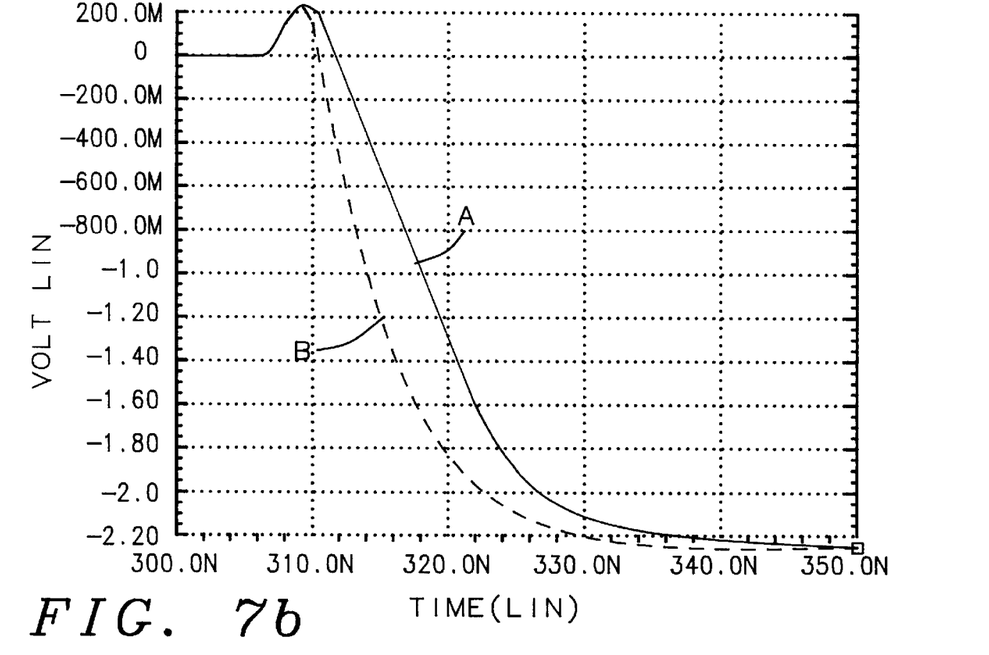

FIG. 7b shows the Spice simulation comparison plots of 2 op-amp switched capacitor integrators similar to FIG. 5a. One is with the bottom plate stray capacitance (Cp) connected to the input (B) and the other connected to the output (A). The following values were chosen for the capacitance values—$C_i$=3pF, $C_f$=5pF, $C_p$=5pF, $C_l$=1pF. A voltage step was used as the input stimulus.

It can be seen that the maximum slew rate of the integrator with the bottom plate capacitor connected to the input is higher. It can also be seen that the time that this integrator output is slewing is less and it moves into the linear settling mode faster.

Since the settling time of an op-amp consists of the slewing part which depends on the slew rate and the linear part which depends on the settling time constant, the overall settling time for the op-amp with the stray capacitance placed at the input is less. This also means that this configuration of placing the stray capacitance at the input of the op-amp is a better choice for low power or high speed switched capacitor circuits.

As will be understood by those skilled in the art, if the design of the switched capacitor filter of FIG. 5a was made fully differential, the placing of the parasitic capacitances at the input nodes + and − of the operational amplifier op amp, any residual noise that may be coupled to the N-well diffusion 10 of FIGS. 2 and 4 will be common mode noise and greatly attenuated.

Furthermore, using the bottom plate, as the summing node of a switched capacitor integrator would attenuate the charge injection from the switches connected to the summing node.

Figure 6A:
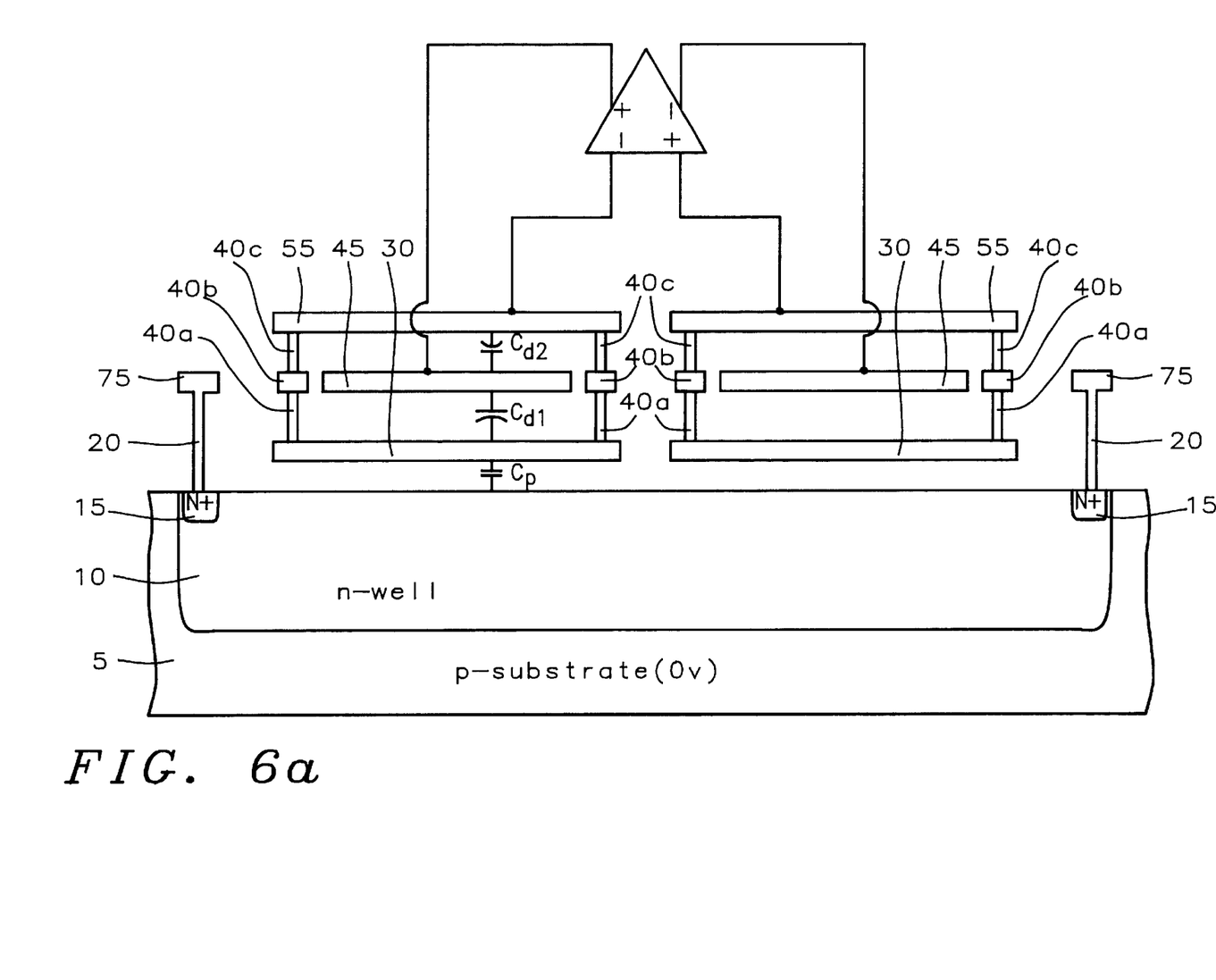
FIG. 6a is a cross sectional view of the capacitor structure used as a non-switched feedback capacitor in a fully differential switched capacitor circuit.
Figure 6B:
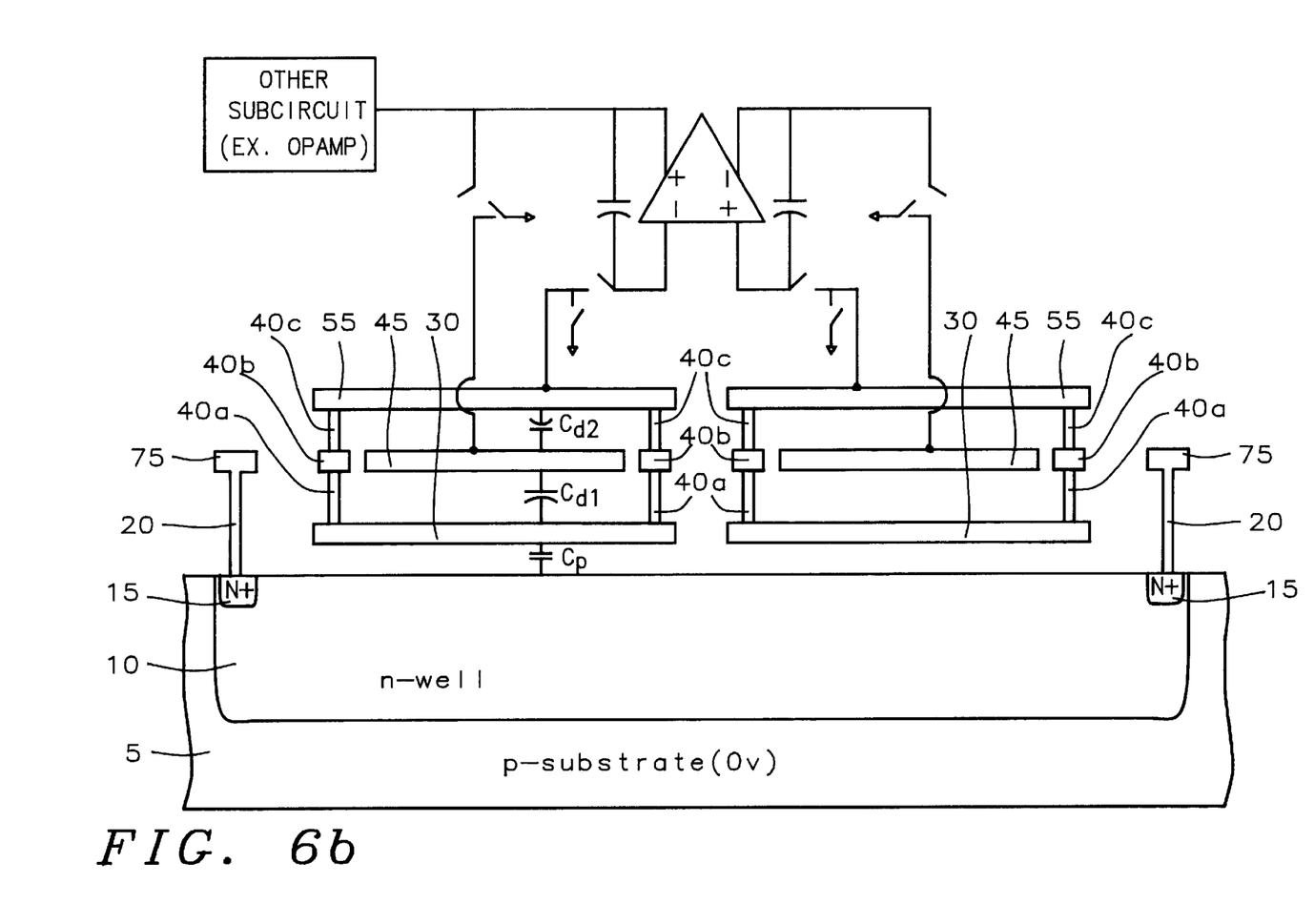
FIG. 6b is a cross sectional view of the capacitor structure used as a switched feedback capacitor in a fully differential switched capacitor circuit.

FIG. 6a is a cross sectional view of the capacitor structure being used in a fully differential switched capacitor circuit as a non-switched feedback capacitor. FIG. 6b shows a cross sectional view of the capacitor structure used as a switched feedback capacitor in the same fully differential circuit.

Additionally, as will also be understood by those skilled in the art, the capacitor structure that has been shown with a single polycrystalline silicon or polycide layer and two metal layers (which could be readily manufactured using an SPDM (Single Poly Double Metal) IC process) could be easily implemented in other integrated circuit processing technologies employing multiple polycrystalline silicon layers and multiple wiring layers. These include, for example, DPDM (Double Poly Double Metal), DPTM (Double Poly Triple Metal) or SPTM (Single Poly Triple Metal). In the double poly processes, the second plate would be formed of polycrystalline silicon rather than metal.

While this invention has been particularly shown and described with reference to the preferred embodiments thereof, it will be understood by those skilled in the art that various changes in form and details may be made without departing from the spirit and scope of the invention. For example, the N-well 10 could be readily replaced with a P-well as the first conductive layer.

What is claimed is:

1. A method for fabricating a capacitor structure on a surface of a semiconductor substrate having a first conductivity type, comprising the steps of:

a) diffusing a material of a second conductivity type within said substrate to form a diffusion well that is an electrical shield to prevent noise and unwanted external signals from coupling to said capacitor structure;

b) coupling the diffusion well to a quiet voltage source isolated from said noise and unwanted external signals with a first plurality of contacting means;

forming over said surface of said diffusion well a first insulating layer;

forming over said first insulating layer a first conducting material to form a first capacitor plate within a first set of boundaries that define said diffusion well;

forming over said first insulating layer and said first capacitor plate a second insulating layer;

forming over said second insulating layer a second conducting material to form a second capacitor plate within a second set of boundaries that define said first capacitor plate;

forming over said second insulating layer and said second capacitor plate a third insulating layer;

forming over said third insulating layer a third conducting material to form a third capacitor plate having boundaries equal to those of the first capacitor plate;

i) forming a second plurality of contacting means to couple said first capacitor plate to said third capacitor plate;

j) connecting said first capacitor plate and said third capacitor plate to external circuitry; and k) connecting said second capacitor plate to external circuitry.

2. The method of claim 1 further comprising the steps of:

a) forming from the second conducting material a shielding layer to surround said second capacitor plate; and b) connecting said shielding layer to the first plurality of contacting means to couple the shielding layer to the quiet voltage source to further shield said second capacitor plate from noise and unwanted external signals.

3. The method of claim 1 wherein said diffusion well and the first capacitor plate form a parasitic capacitor having a magnitude of capacitance equivalent to the magnitude of capacitance of a designed capacitor formed between the first capacitor plate and the second capacitor plate and between the third capacitor plate and the second capacitor plate.

4. The method of claim 2 wherein said capacitor structure can be coupled to said external circuitry so as to minimize effect of said parasitic capacitor upon operating parameters of said external circuitry.

* * * * *